United States Patent
Feng

(10) Patent No.: US 6,897,792 B1
(45) Date of Patent: May 24, 2005

(54) REDUCING NUMBER OF CONSECUTIVE ONES IN DATA-DEPENDENT SCRAMBLER

(75) Inventor: Weishi Feng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/701,661

(22) Filed: Nov. 5, 2003

Related U.S. Application Data

(60) Provisional application No. 60/472,172, filed on May 21, 2003.

(51) Int. Cl.[7] .................................................. H03M 7/00
(52) U.S. Cl. ............................ 341/59; 341/58; 341/68
(58) Field of Search .............................. 341/51, 52, 58, 341/59, 60, 63; 714/752, 755, 753; 369/59.25, 275.3, 59.24

(56) References Cited

U.S. PATENT DOCUMENTS

| | | | | |
|---|---|---|---|---|
| 5,898,394 A | * | 4/1999 | Kobayashi et al. | ........... 341/58 |
| 6,079,041 A | * | 6/2000 | Kunisa et al. | .............. 714/752 |
| 6,177,890 B1 | * | 1/2001 | Keirn et al. | .................. 341/59 |
| 6,241,778 B1 | | 6/2001 | de Lind van Wijngaarden et al. | |
| 6,243,496 B1 | * | 6/2001 | Wilkinson | ................... 382/245 |
| 6,278,386 B1 | * | 8/2001 | Hogan | .......................... 341/58 |
| 6,377,532 B1 | | 4/2002 | Jung et al. | |
| 6,531,968 B2 | * | 3/2003 | Ahn et al. | ..................... 341/59 |
| 6,718,501 B1 | * | 4/2004 | Brody et al. | ................ 714/752 |
| 6,737,996 B2 | * | 5/2004 | Kurokawa et al. | ............ 341/68 |
| 6,778,104 B2 | * | 8/2004 | Chen et al. | .................... 341/59 |

OTHER PUBLICATIONS

U.S. Appl. No. 10/639,796, filed Aug. 12, 2003.
U.S. Appl. No. 10/423,552, filed Apr. 25, 2003.

* cited by examiner

*Primary Examiner*—Michael Tokar
*Assistant Examiner*—Linh Van Nguyen

(57) ABSTRACT

A data dependent scrambler (DDS) for a communications channel that transmits a user data sequence having a plurality of symbols includes a scrambler that generates a scrambled user data sequence that is based on the user data sequence and a seed. A first encoder selectively interleaves adjacent symbols in the scrambled user data sequence if an all-zero symbol is produced by bit interleaving. The first encoder identifies a pivot bit that is adjacent to the all-zero symbol if interleaving is performed and replaces the all-zero symbol with an all-one symbol if the pivot bit is zero.

99 Claims, 7 Drawing Sheets

REDUCING NUMBER OF CONSECUTIVE ONES IN DATA-DEPENDENT SCRAMBLER

CROSS-REFERENCE TO RELATED APPLICATIONS

This application claims the benefit of U.S. Provisional Application No. 60/472,172, filed on May 21, 2003, which is hereby incorporated by reference in its entirety.

FIELD OF THE INVENTION

The present invention relates to data coding in a communications channel, and more particularly to data coding that reduces the number of consecutive ones in a communications channel.

BACKGROUND OF THE INVENTION

Magnetic storage systems such as disk drives include a magnetic medium or platter with a magnetic coating that is divided into data tracks. The data tracks are divided into data sectors that store fixed-sized data blocks. A read/write head typically includes a write circuit and write element such as an inductor that selectively generates positive and negative magnetic fields that are stored by the magnetic medium. The stored positive and negative fields represent binary ones and zeros. The read/write head includes an element such as a magneto-resistive element that senses the stored magnetic field to read data from the magnetic medium. A spindle motor rotates the platter and an actuator arm positions the read/write head relative to the magnetic medium.

Magnetic storage systems typically code the user data using Run Length Limited (RLL) code. RLL coding reduces sequences in the user data that may cause problems with timing circuits of the magnetic storage system. For example, RLL code may enforce constraints on the number of consecutive ones and/or zeros that are allowed to occur in the data. The efficiency of the RLL code is typically measured in terms of a code rate. For every m-bits or m-bytes of user data, an n-bit or n-byte encoded word is written to the storage media. RLL codes are used to eliminate unwanted bit patterns in the original data and typically do not have error correction capability. RLL coding, however, reduces data storage capacity by increasing channel bit density (CBD), which reduces a signal to noise ratio (SNR) and may lead to lower data reliability.

Referring now to FIG. 1, a write-path of a data storage system with RLL coding is shown. A host bus interface (HBI) 14 receives a user data sequence from a host computer 16. For example, the user data sequence may include 4096 bits of a sector, which are arranged in 410 10-bit symbols. A buffer manager (BM) 18 stores the user data sequence in a buffer 20 and then sends the user data sequence from the buffer 20 to a disk formatter (DF) 22 with proper timing. An ECC/CRC encoder 24 appends CRC and ECC bits to the user data sequence.

The ECC bits are computed based on the user data sequence and the CRC bits. A scrambler 26 generates a pseudo-random sequence that is based on a polynomial and seed. The user data sequence and the scrambler sequence are then input to an XOR gate 27, which outputs a scrambled user data sequence. A RLL encoder 28 is used to constrain the unwanted bit patterns in the scrambled sequence.

To increase SNR and data storage capacity, data storage systems were developed without RLL coding using data-dependent scramblers (DDS). Data is processed by the DDS to eliminate unwanted bit patterns. The DDS is disclosed in "Improved Data Coding For Enforcing Constraints On Ones and Zeros In a Communications Channel", U.S. patent application Ser. No. 10/423,552, filed Apr. 25, 2003, which is commonly assigned and is hereby incorporated by reference in its entirety. The scrambled user data sequence from the DDS is forwarded to an ECC/CRC device, which generates and appends CRC and ECC bits to the scrambled user data.

Because the CRC and ECC bits that are generated may also contain unwanted bit patterns, traditional RLL coding may be used to encode the ECC/CRC portion. The data storage system is still referred to as being without RLL coding because the CRC and/or ECC bits are relatively small in number as compared to the number of bits in the user data sequence.

The data storage system using the DDS provides a global constraint (G) (i.e., longest length of a run of consecutive zeros) of 2*M, where M is the symbol size (e.g., 10-bits). Such a data storage system further provides an interleave constraint (I) (i.e., longest run of consecutive zeros in an interleaved subsequence) of 2*(M−1). In the case of a 10-bit symbol size, the G/I constraint is 20/18. However, the maximum number of consecutive ones is 4*M−2. In the case of a 10-bit symbol size, the maximum length of ones can be up to 38. It is desirable to reduce the maximum number of consecutive ones while maintaining the G/I constraint.

SUMMARY OF THE INVENTION

Accordingly, the present invention provides a data dependent scrambler (DDS) for a communications channel that transmits a user data sequence having a plurality of symbols. The DDS includes a scrambler that generates a scrambled user data sequence that is based on the user data sequence and a seed. A first encoder selectively interleaves adjacent symbols in the scrambled user data sequence if an all-zero symbol is produced by bit interleaving. The first encoder identifies a pivot bit that is adjacent to the all-zero symbol if interleaving is performed and replaces the all-zero symbol with an all-one symbol if the pivot bit is zero.

In one feature, the DDS further includes a seed finder that selects the seed based on the symbols of the user data sequence.

In another feature, the scrambler performs a bit-wise XOR operation on the user data sequence and the seed to generate the scrambled user data sequence.

In another feature, the DDS further includes a code finder that selects an H-code based on symbols of the user data sequence. The DDS further includes a second encoder that reduces a Hamming weight of the scrambled user data sequence using the H-code, the seed and the scrambled user data sequence. The second encoder generates a first token and a second token. The first token is determined based on the seed and the H-code. The first token is determined by a bit-wise XOR operation on the seed and the H-code. The second token is a ones complement of the first token.

In still another feature, the second encoder includes a symbol lookup table, processes two adjacent symbols of the scrambled user data sequence at a time and selectively employs the first and second tokens and the symbol lookup table to encode the scrambled user data based on a Hamming weight of the two adjacent symbols.

In yet another feature, the DDS is implemented in a write path of a data storage device.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
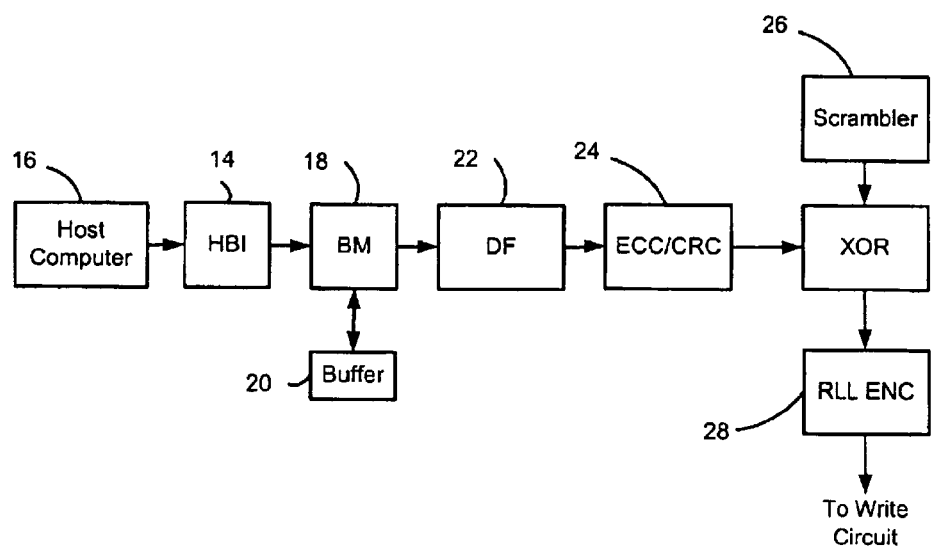
FIG. 1 is a functional block diagram of a data storage system with RLL coding according the prior art.

The following description of the preferred embodiments is merely exemplary in nature and is in no way intended to limit the invention, its application, or uses. For purposes of clarity, the same reference numbers will be used in the drawings to identify the similar elements.

While the present invention will be described in the context of a data storage system, skilled artisans will appreciate that the present invention can be applied to any binary communications channel with constraints on the number of consecutive ones or zeros. As will be described further below, the data storage system according to the present invention does not employ RLL coding on a user data portion. The present invention discloses a coding technique that eliminates unwanted bit patterns with a smaller reduction in data storage capacity as compared to RLL coding. In other words, the coding technique according to the present invention reduces the channel bit density (CBD) less than data storage systems using RLL coding on the user data. As used herein, the term data dependent scrambler (DDS) is defined as a scrambler that alters at least one of a selected scrambler, a generating polynomial, a seed, and a scrambling sequence based upon current user data that is to be scrambled.

Figure 2A:
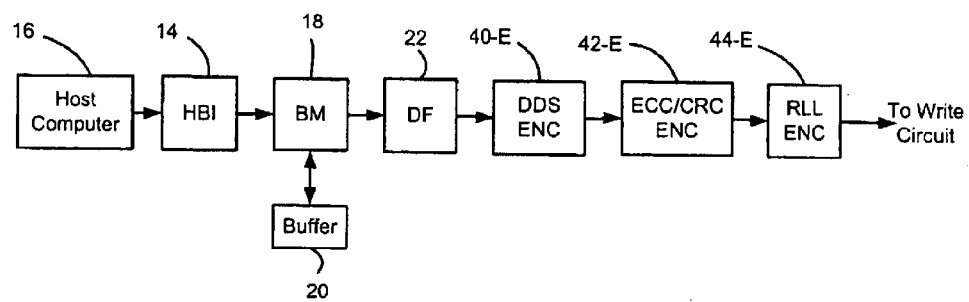
FIGS. 2A and 2B are functional block diagrams of write and read paths, respectively, in a data storage system without RLL coding according ot the present invention.

FIG. 2A illustrates a write-path of a data storage system without RLL coding according to the present invention. The host computer 16 transmits a user data sequence to the host bus interface (HBI) 14. The buffer manager (BM) 18 receives the user data sequence from the HBI 14 and controls the data flow through the write path. The user data sequence is stored in the buffer 20. The BM 18 passes the user data sequence on based on the timing of data flow through the write path. The disk formatter (DF) 22 receives the user data sequence from the BM 18 and formats the user data sequence based on the data storage device.

A data dependent scrambler (DDS) encoder 40-E according to the present invention receives the user data sequence from the DF 22. The DDS encoder 40-E scrambles and processes the user data sequence to eliminate unwanted bit patterns. The DDS encoder 42-E appends a seed S and an H-code token (H) to the scrambled user data. Interleaving may also be performed. An ECC/CRC encoder 42-E appends CRC bits that are calculated based on the DOS encoded user data sequence. The ECC/CRC encoder 42-E also appends ECC bits that are computed based on the DDS encoded user data sequence and CRC bits. A RLL encoder 44-E encodes the appended ECC and CRC bits to reduce unwanted bit patterns in the ECC/CRC bits.

Figure 2B:
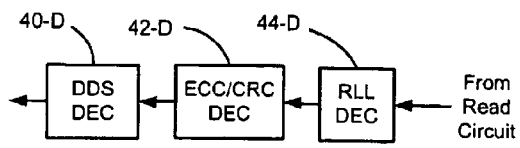

Referring now to FIG. 2B, a partial read path is shown. An RLL decoder 44-D receives the read user data sequence, and decodes the RLL code to recover the CRC and ECC bits and passes. The ECC/CRC decoder 42-D attempts to correct all possible errors in the user data sequence. The DDS decoder 40-D uses the seed S and the H-code token H to recover the user data sequence.

Figure 3A:
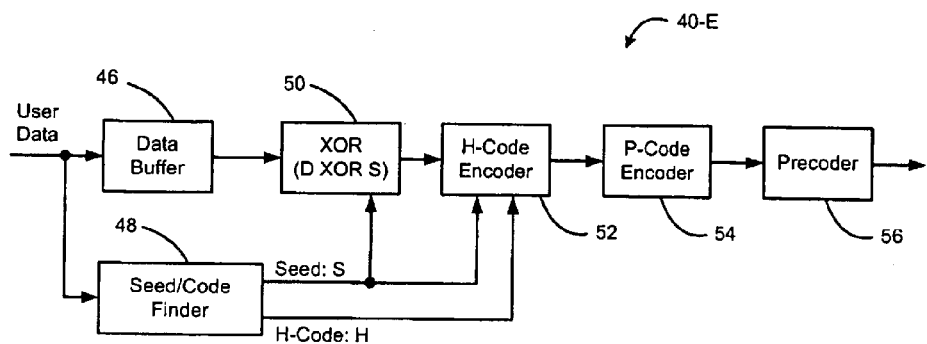
FIGS. 3A and 3B are functional block diagrams of encoding and decoding data dependent scramblers (DDS), respectively, of the data storage systems of FIGS. 2A and 2B, respectively.

Referring now to FIG. 3A, the DOS encoder 40-E will be described in further detail. The DDS encoder 40-E includes a data buffer 46 that receives the user data sequence and coordinates data transfer timing through the DDS 40-E. A seed/code finder 48 generates the seed (S) and the H-code token (H). A first exclusive or (XOR) gate 50 performs a bit-wise XOR operation on the user data sequence and the seed (S) to generate a scrambled user data sequence. An H-code encoder 52 receives the scrambled user data sequence and encodes the scrambled user data sequence to improve the worst-case Hamming weight thereof using the H-code H and the seed S. A P-code encoder 54 receives the H-code encoded user data sequence and selectively performs interleaving on the data sequence to limit the maximum length of a run of zeros and ones in the subsequences. A precoder 56 transfers all data in the interleaved nonreturn-to-zero invrse (INRZI) or nonreturn-to-zero-inverse (NRZI) domain into the nonreturn-to-zero (NRZ) domain.

Figure 3B:
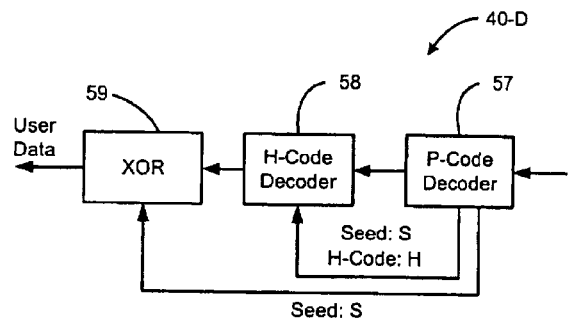

In FIG. 3B, the P-code decoder 57 reverses the P-coding described above and below. The P-code decoder 57 outputs the H-code token H and the seed S to an H-code decoder 58, which reverses the H-code encoding that was performed above. The seed S is output to an XOR gate 59, which also receives the scrambled user data sequence. The XOR gate 59 performs bit-wise XOR on the scrambled user data and the seed to generate the user data sequence.

Figure 4:
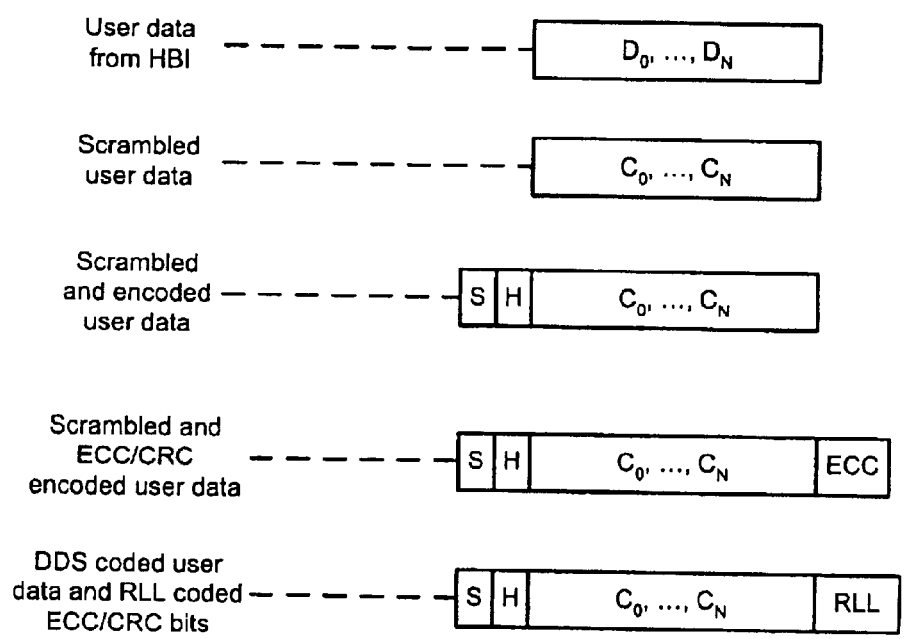
FIG. 4 illustrates a user data sequence as it is processed through the DDS.
Figure 5A:
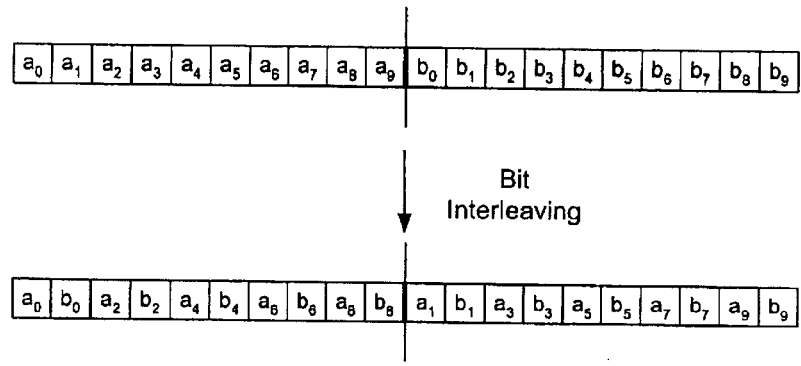
FIGS. 5A, 5B and 5C illustrate adjacent symbols of the user data sequence before and after interleaving.
Figure 5B:
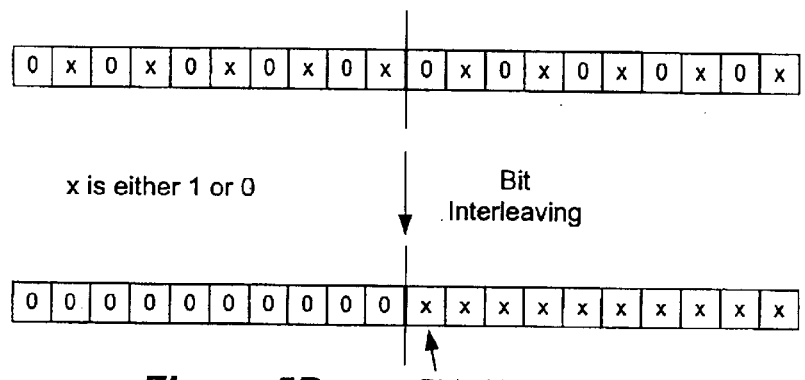
Figure 5C:
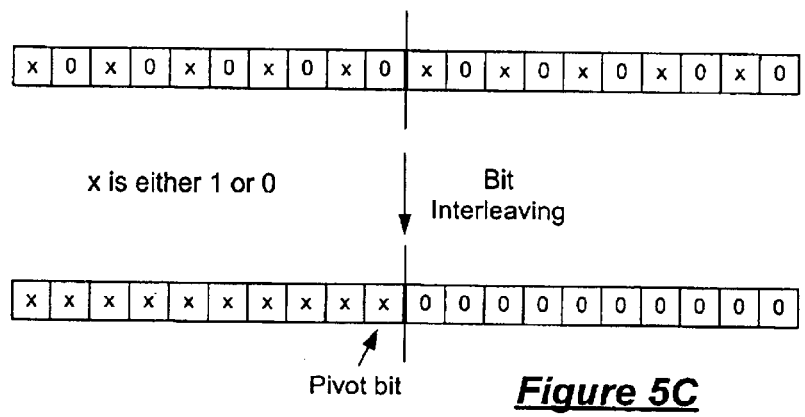
Figure 6:
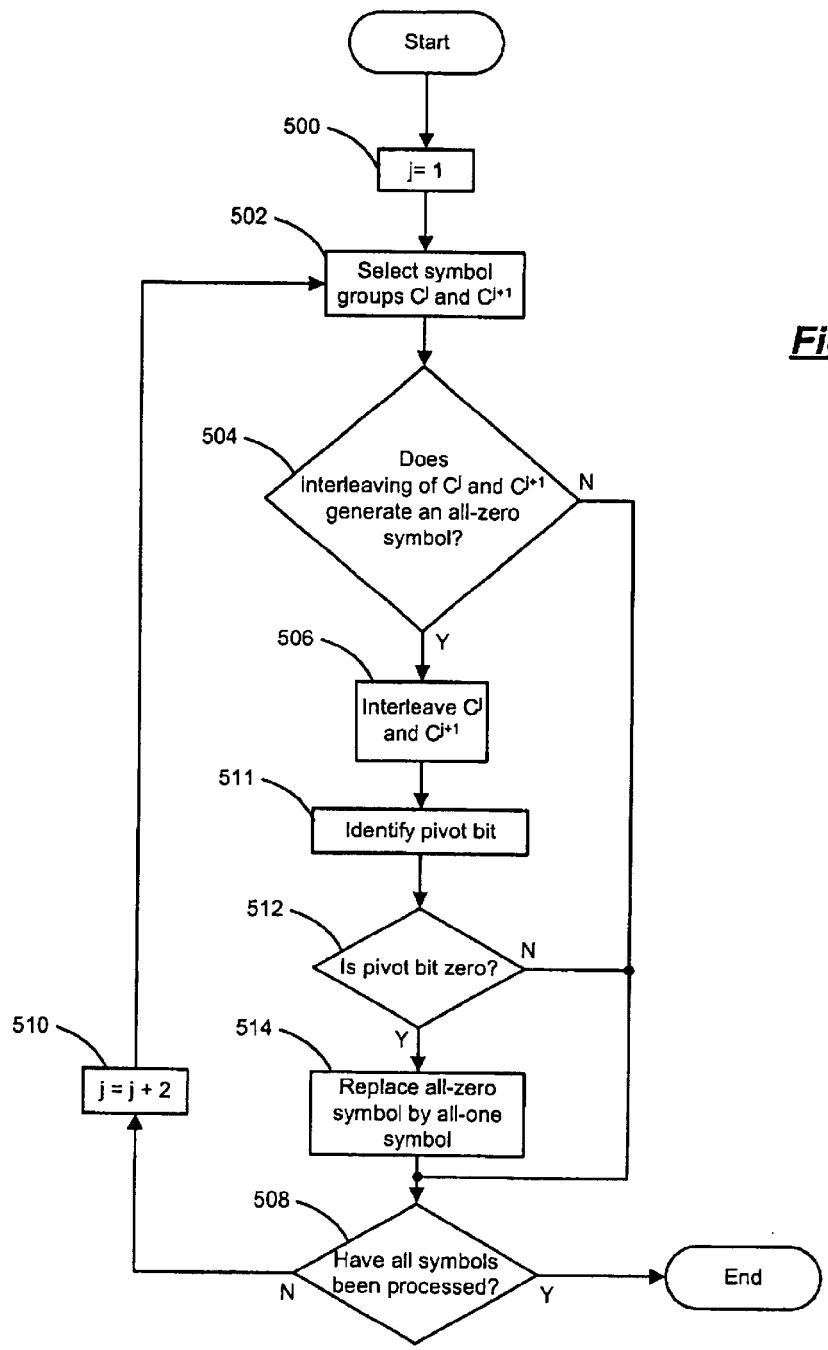
FIG. 6 is a flowchart illustrating user data processing through the DDS in the write path according to the present invention.

Referring now to FIGS. 3A and 4, the function of the DDS 40-E on the write path will be described with reference to changes in the user data sequence. An exemplary M-bit symbol data sequence ($D=\{D_{N-1}, D_{N-2}, \ldots, D_0\}$) of size N is used, where M=10 (i.e., 10-bit symbol data sequence). For other symbol sizes or data lengths, similar DDS's can be constructed based on the principles of the present invention. Initially, the user data (D) is sent to the data buffer 46 and the seed/code finder 48. The seed (S) that is generated by the seed/code finder 48 is also input to the XOR gate 50. The delay of the data buffer 46 is sufficient to allow the scrambling sequence to be generated by the seed/code finder 48.

Given the exemplary data sequence D, there are 1023 non-zero 10-bit symbols. More specifically, if the number of bits in the symbol is M, it is always possible to find a seed S if $N<2^M$. This is because not all of the $2^M$ different possible symbols can be included in a data sequence of fewer than $2^M$ symbols. Assuming that the user data includes 4096 bits organized into 10-bit symbols, there are at least 203 (1023−2*410) non-zero symbols that exist that are different from any of the data symbols and their complements (i.e., bit-wise inversion). More particularly, the seed/code finder 48 searches symbols S and H in the set of {1, 2, 3, . . . , 511} excluding the weight one symbols, such that S and H are different from any of the symbols and their complements in the user data symbols of set D. H, however, is preferably not the ones complement of S. Any one of the remaining symbols can be selected as S and H, which are sent to the first XOR gate 50 and H-code encoder 52.

A scrambling sequence (S, S, . . . , S) is formed by repeating seed S N times. The first XOR gate 50 performs bit-wise XOR of the scrambling sequence {S, S, . . . , S} with the data sequence D={$D_{N-1}$, $D_{N-2}$, . . . , $D_0$} to generate a scrambled sequence C={$C_{N-1}$, $C_{N-2}$, . . . , $C_0$}. The scrambled data sequence (C={$C_{N-1}$, $C_{N-2}$, . . . , $C_0$}) does not contain either an all-zero symbol or an all-one symbol. That is to say, every symbol in the data sequence is non-zero. At a minimum, each symbol may include only one "1" and nine "0"'s, providing a worst-case Hamming weight of 10% for the scrambled data sequence. In binary signaling, the Hamming weight is the number of "1" bits in the binary sequence.

To improve the worst-case Hamming weight of the scrambled user data sequence C, the H-code encoder 52 is implemented. The H-code encoder 52 uses a token ($token_1$) and its complement ($token_2$) to indicate that coding has occurred. In this manner, the H-code decoder 58 on the read path can reverse the H-code encoding process. $Token_1$ is selected such that it is different than any of the scrambled user data symbols of set C and their complements and such that it is not the all "1" symbol. The H-code encoder 52 uses S XOR H as $token_1$. Since H is different from any of the user data symbols and their complements, it follows that both $token_1$ and $token_2$ are different from any of the scrambled data symbols of the set C.

A 10-bit to 6-bit look-up table maps the 10-bit symbols of weight one or weight two into 6-bit patterns having at least weight two. The 10-bit to 6-bit look-up table is a static table that can be stored in memory. There are ten weight one 10-bit symbols and forty-five weight two 10-bit symbols. In total, there are fifty-five 10-bit symbols to convert using the table. Further, there are fifteen weight two 6-bit patterns, twenty weight three 6-bit patterns, fifteen weight four 6-bit patterns, six weight five 6-bit patterns and one weight six 6-bit pattern. Therefore, the fifty-five weight one and weight two 10-bit symbols can be converted into fifty-five of the fifty-seven possible 6-bit symbols of weight two or greater. This enables a reversible correspondence, such as a one-to-one correspondence.

The H-code encoder 52 processes the scrambled symbol set C two symbols at a time. If the total Hamming weight of the two symbol group is at least four, the data is passed on. If the total Hamming weight of the two symbol group is two or three (i.e., [1,1] or [1,2]), a symbol replacement occurs as follows: The H-code encoder 52 inserts $token_1$ for the symbol on the left (i.e., the first symbol of the two-symbol set). For the symbol on the right (i.e., the second symbol of the two-symbol set), the first four bits of the 10-bit symbol are used to indicate the position of the "1" in the weight one symbol. The second symbol is converted into a 6-bit symbol using the table described above. If the Hamming weight of the two-symbol group is three with [2,1], the H-code encoder 52 inserts $token_2$ on the left. As described above, the H-code encoder 52 uses the first four bits of the 10-bit symbol to indicate the position of the "1" in the weight one symbol. The second symbol is converted into a 6-bit symbol using the table described above.

A more detailed description of the operation and function of the H-code encoder 52 is provided in co-pending U.S. patent application Ser. No. 10/639,796, entitled "Methods and Apparatus for Improving Minimum Hamming Weights of a Sequence", filed on Aug. 12, 2003, the disclosure of which is hereby incorporated by reference in its entirety.

The H-code data sequence does not contain either the all-zero symbol or the all-one symbol. As a result, a global constraint (G) is 18. This means that there are at most, 18 consecutive zeros in the H-coded data sequence. However, it is still possible to have a long run of zeros in the subsequences. The P-code encoder 54 according to the present invention limits the maximum length of a run of zeros in the sub-sequences by selectively interleaving adjacent symbols as will be described below.

Referring now to FIGS. 5A, 5B, 5C and 6, the P-code coding process will be described in detail. In step 500, an index (j) is set equal to 1 (j=1). The P-code encoder 54 processes the scrambled data sequence (C) two adjacent symbols at a time. If an all-zero symbol occurs after bit-interleaving as determined in step 504, bit interleaving is performed in step 506. Otherwise, control determines whether there are additional symbols in step 508. If true, j is set equal to j+2 in step 510. Otherwise, control ends.

After bit interleaving is performed in step 506, an all-zero symbol is generated and the other non-zero symbol has a Hamming weight of at least four. Bit interleaving of the two symbols may generate symbols that are the same as either $token_1$ or $token_2$. This, however, does not create any difficulties when decoding because a P-code decoder 57 processes the data before the H-code decoder 58. Further, the P-code decoded data sequence does not contain any tokens other than those generated by the H-code encoder 52.

In step 511, a pivot bit is identified. The pivot bit is the bit of the non-all-zero symbol that is adjacent to the all-zero symbol as shown in the examples in FIGS. 5B and 5C. The P-code encoder 54 determines whether the pivot bit is zero in step 512. If the pivot bit is zero, the P-code encoder replaces the all-zero symbol by the all-one symbol in step 514. If the pivot bit is one, the P-code encoder continues with step 508 as described above.

Figure 7:
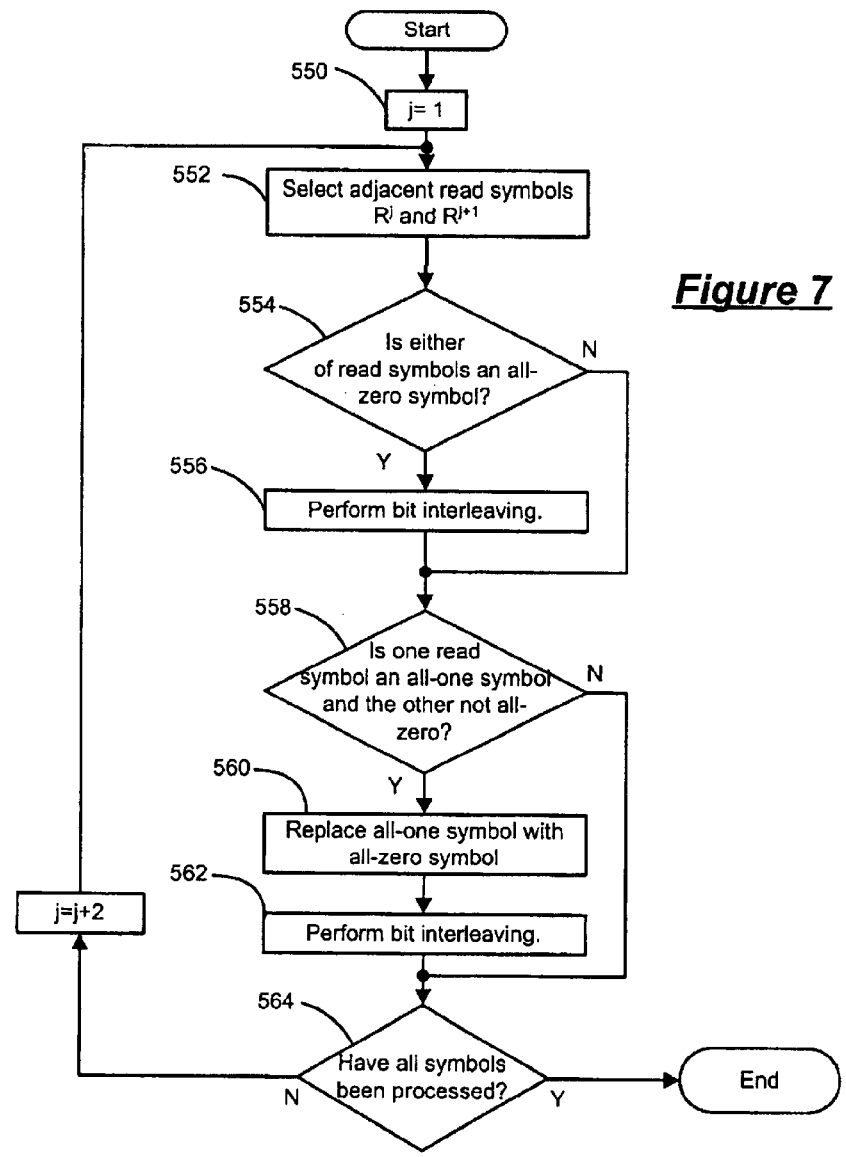
FIG. 7 is a flowchart illustrating user data processing through the DDS in the read path according to the present invention.

Referring now to FIG. 7, when decoding the P-coded data sequence, the P-code decoder 57 processes the symbols of the data sequence two at a time. In step 550, control sets j=1 and reads adjacent symbols in step 552. If there is an all-zero symbol in the two symbol group as determined in step 554, bit interleaving is performed in step 556. If there is an all-one symbol and a non-all-zero symbol in a group as determined in step 558, the all-one symbol is replaced by the all-zero symbol in step 560 and bit interleaving is performed in step 562.

As a result of the P-code encoding, the global constraint (G) is increased. The longest length of a run of zeros is 2*M, where M is the symbol size. The interleave constraint (I) is 2*(M−1). In the case of a 10-bit symbol, the DDS achieves a G/I constraint of 20/18 and a minimum Hamming weight of 20%. Further, the maximum length of a run of ones is reduced to 20, as compared to 38 in prior systems with M=10.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A data dependent scrambler (DDS) for a communications channel that transmits a user data sequence having a plurality of symbols, comprising:
a scrambler that generates a scrambled user data sequence that is based on said user data sequence and a seed; and
a first encoder that selectively interleaves adjacent symbols in said scrambled user data sequence if an all-zero symbol is produced by bit interleaving, that identifies a pivot bit that is adjacent to said all-zero symbol if interleaving is performed, and that replaces said all-zero symbol with an all-one symbol if said pivot bit is zero.

2. The DDS of claim 1 further comprising a seed finder that selects said seed based on said symbols of said user data sequence.

3. The DDS of claim 1 wherein said scrambler performs a bit-wise XOR operation on said user data sequence and said seed to generate said scrambled user data sequence.

4. The DDS of claim 1 further comprising a code finder that selects an H-code based on symbols of said user data sequence.

5. The DDS of claim 4 further comprising a second encoder that guarantees a minimum Hamming weight of said scrambled user data sequence using said H-code, said seed and said scrambled user data sequence.

6. The DDS of claim 5 wherein said second encoder generates a first token and a second token.

7. The DDS of claim 6 wherein said first token is determined based on said seed and said H-code.

8. The DDS of claim 7 wherein said first token is determined by a bit-wise XOR operation on said seed and said H-code.

9. The DDS of claim 6 wherein said second token is a ones complement of said first token.

10. The DDS of claim 5 wherein said second encoder includes a symbol lookup table, processes two adjacent symbols of said scrambled user data sequence at a time and selectively employs said first and second tokens and said symbol lookup table to encode said scrambled user data based on a Hamming weight of said two adjacent symbols.

11. The DDS of claim 1 wherein said DDS is implemented in a write path of a data storage device.

12. A communications channel that transmits a user data sequence having a plurality of symbols, comprising:
a host bus interface (HBI) that receives said user data sequence; and
a data dependent scrambler (DDS) that receives said user data sequence from said HBI and that includes:
a scrambler that generates a scrambled user data sequence that is based on said user data sequence and a seed; and
a first encoder that selectively interleaves adjacent symbols in said scrambled user data sequence if an all-zero symbol is produced by bit interleaving, that identifies a pivot bit that is adjacent to said all-zero symbol if interleaving is performed, and that replaces said all-zero symbol with an all-one symbol if said pivot bit is zero.

13. The communications channel of claim 12 further comprising an error correction coding and cyclic redundancy check (ECC/CRC) device that generates ECC and CRC bits that are based on said scrambled user data sequence.

14. The communications channel of claim 13 further comprising a run length limited (RLL) coding device that generates an RLL sequence based on said ECC bits and said CRC bits.

15. The communications channel of claim 12 wherein said DDS further comprises a seed finder that selects said seed based on said symbols of said user data sequence.

16. The communications channel claim 12 wherein said scrambler performs a bit-wise XOR operation on said user data sequence and said seed to generate said scrambled user data sequence.

17. The communications channel of claim 12 wherein said DDS further comprises a code finder that selects an H-code based on symbols of said user data sequence.

18. The communications channel of claim 17 wherein said DDS further comprises a second encoder that guarantees a minimum Hamming weight of said scrambled user data sequence using said H-code, said seed and said scrambled user data sequence.

19. The communications channel claim 18 wherein said second encoder generates a first token and a second token.

20. The communications channel claim 19 wherein said first token is determined based on said seed and said H-code.

21. The communications channel claim 20 wherein said first token is determined by a bit-wise XOR operation on said seed and said H-code.

22. The communications channel claim 19 wherein said second token is a ones complement of said first token.

23. The communications channel claim 18 wherein said second encoder includes a symbol lookup table, processes two adjacent symbols of said scrambled user data sequence at a time and selectively employs said first and second tokens and said symbol lookup table to encode said scrambled user data based on a Hamming weight of said two adjacent symbols.

24. The communications channel claim 12 wherein said DDS is implemented in a write path of a data storage device.

25. A method of scrambling a user data sequence that has a plurality of symbols and that is transmitted through a communications channel, comprising:
scrambling said user data sequence based on said user data sequence and a seed to provide a scrambled user data sequence;
interleaving adjacent symbols in said scrambled user data sequence if an all-zero symbol is produced by bit interleaving;
identifying a pivot bit that is adjacent to said all-zero symbol if interleaving is performed; and
replacing said all-zero symbol with an all-one symbol if said pivot bit is zero.

26. The method of claim 25 further comprising selecting said seed based on said symbols of said user data sequence.

27. The method of claim 25 wherein said scrambling is performed using a bit-wise XOR operation on said user data sequence and said seed.

28. The method of claim 25 further comprising selecting an H-code based on symbols of said user data sequence.

29. The method of claim 28 further comprising guaranteeing a minimum Hamming weight of said scrambled user data sequence using said H-code, said seed and said scrambled user data sequence.

30. The method of claim 29 wherein said guaranteeing step is performed based on a first token and a second token.

31. The method of claim 30 wherein said first token is determined based on said seed and said H-code.

32. The method of claim 31 further comprising determining said first token by a bit-wise XOR operation on said seed and said H-code.

33. The method of claim 30 wherein said second token is a ones complement of said first token.

34. The method of claim 29 further comprising:
processing two adjacent symbols of said scrambled user data sequence at a time; and
employing said first and second tokens and a symbol lookup table to selectively encode said scrambled user data based on a Hamming weight of said two adjacent symbols.

35. A method of transmitting a user data sequence having a plurality of symbols over a communications channel, comprising:
receiving said user data sequence at a host bus interface (HBI);
relaying said user data sequence from said HBI to a data dependent scrambler (DDS);
scrambling said user data sequence based on said user data sequence and a seed to provide a scrambled user data sequence; and
interleaving adjacent symbols in said scrambled user data sequence if an all-zero symbol is produced by bit interleaving;
identifying a pivot bit that is adjacent to said all-zero symbol if interleaving is performed; and
replacing said all-zero symbol with an all-one symbol if said pivot bit is zero.

36. The method of claim 35 further comprising generating error correction coding (ECC) and cyclic redundancy check (CRC) bits based on said scrambled user data sequence.

37. The method of claim 36 further comprising generating a run length limited (RLL) sequence based on said ECC bits and said CRC bits.

38. The method of claim 35 further comprising selecting said seed based on said symbols of said user data sequence.

39. The method of claim 35 wherein said scrambling is performed using a bit-wise XOR operation on said user data sequence and said seed.

40. The method of claim 35 further comprising selecting an H-code based on symbols of said user data sequence.

41. The method of claim 40 further comprising guaranteeing a minimum Hamming weight of said scrambled user data sequence using said H-code, said seed and said scrambled user data sequence.

42. The method of claim 41 wherein said guaranteeing step is based on a first token and a second token.

43. The method of claim 42 wherein said first token is determined based on said seed and said H-code.

44. The method of claim 43 further comprising determining said first token by a bit-wise XOR operation on said seed and said H-code.

45. The method of claim 42 wherein said second token is a ones complement of said first token.

46. The method of claim 41 further comprising:
providing a symbol lookup table;
processing two adjacent symbols of said scrambled user data sequence at a time; and
employing said first and second tokens and said symbol lookup table to selectively encode said scrambled user data based on a Hamming weight of said two adjacent symbols.

47. A data dependent scrambler (DDS) for a communications channel that transmits a user data sequence having a plurality of symbols, comprising:
scrambling means for generating a scrambled user data sequence that is based on said user data sequence and a seed; and
first encoding means for selectively interleaving adjacent symbols in said scrambled user data sequence if an all-zero symbol is produced by bit interleaving, for identifying a pivot bit that is adjacent to said all-zero symbol if interleaving is performed, and for replacing said all-zero symbol with an all-one symbol if said pivot bit is zero.

48. The DDS of claim 47 further comprising seed finding means for selecting said seed based on said symbols of said user data sequence.

49. The DDS of claim 47 wherein said scrambling means performs a bit-wise XOR operation on said user data sequence and said seed to generate said scrambled user data sequence.

50. The DDS of claim 47 further comprising code finding means for selecting an H-code based on symbols of said user data sequence.

51. The DDS of claim 50 further comprising second encoding means for guaranteeing a minimum Hamming weight of said scrambled user data sequence using said H-code, said seed and said scrambled user data sequence.

52. The DDS of claim 51 wherein said second encoding means generates a first token and a second token.

53. The DDS of claim 52 wherein said first token is determined based on said seed and said H-code.

54. The DDS of claim 53 wherein said first token is determined by a bit-wise XOR operation on said seed and said H-code.

55. The DDS of claim 52 wherein said second token is a ones complement of said first token.

56. The DDS of claim 51 wherein said second encoding means includes a symbol lookup table, processes two adjacent symbols of said scrambled user data sequence at a time and selectively employs said first and second tokens and said symbol lookup table to encode said scrambled user data based on a Hamming weight of said two adjacent symbols.

57. The DDS of claim 47 wherein said DDS is implemented in a write path of a data storage device.

58. A communications channel that transmits a user data sequence having a plurality of symbols, comprising:
interface means for receiving said user data sequence; and
data dependent scrambling means for receiving said user data sequence from said interface means and including:
scrambling means for producing a scrambled user data sequence that is based on said user data sequence and a seed; and
first encoding means for selectively interleaving adjacent symbols in said scrambled user data sequence if an all-zero symbol is produced by bit interleaving, for identifying a pivot bit that is adjacent to said all-zero symbol if interleaving is performed, and for replacing said all-zero symbol with an all-one symbol if said pivot bit is zero.

59. The communications channel of claim 58 further comprising error correction coding and cyclic redundancy check (ECC/CRC) means for generating ECC and CRC bits that are based on said scrambled user data sequence.

60. The communications channel of claim 59 further comprising run length limited (RLL) coding means for generating an RLL sequence based on said ECC bits and said CRC bits.

61. The communications channel of claim 58 wherein said data dependent scrambling means further comprises seed finding means for selecting said seed based on said symbols of said user data sequence.

62. The communications channel claim 58 wherein said scrambling means performs a bit-wise XOR operation on said user data sequence and said seed to generate said scrambled user data sequence.

63. The communications channel of claim 58 wherein said data dependent scrambling means further comprises code finding means for selecting an H-code based on symbols of said user data sequence.

64. The communications channel of claim 63 wherein said data dependent scrambling means further comprises second encoding means for guaranteeing a minimum Hamming weight of said scrambled user data sequence using said H-code, said seed and said scrambled user data sequence.

65. The communications channel claim 64 wherein said second encoding means generates a first token and a second token.

66. The communications channel claim 65 wherein said first token is determined based on said seed and said H-code.

67. The communications channel claim 66 wherein said first token is determined by a bit-wise XOR operation on said seed and said H-code.

68. The communications channel claim 65 wherein said second token is a ones complement of said first token.

69. The communications channel claim 64 wherein said second encoding means includes a symbol lookup table, processes two adjacent symbols of said scrambled user data sequence at a time and selectively employs said first and second tokens and said symbol lookup table to encode said scrambled user data based on a Hamming weight of said two adjacent symbols.

70. The communications channel claim 58 wherein said data dependent scrambling means is implemented in a write path of a data storage device.

71. A data dependent descrambler (DDD) for a communications channel that receives a scrambled user data sequence having a plurality of symbols and a seed, comprising:
    a first decoder that processes pairs of said symbols, that selectively interleaves adjacent symbols in said scrambled user data sequence when an all-zero symbol is present and that replaces an all-one symbol with an all-zero symbol and interleaves said adjacent symbols when one of said adjacent symbols is an all-one symbol and another of said adjacent symbols is not an all-zero symbol; and
    a descrambler that generates a user data sequence that is based on said scrambled user data sequence and said seed.

72. The DDD of claim 71 wherein said descrambler performs a bit-wise XOR operation on said scrambled user data sequence and said seed to generate said user data sequence.

73. The DDD of claim 71 wherein said DDD receives an H-code and further comprising a second decoder that guarantees a minimum Hamming weight of said scrambled user data sequence using said H-code, said seed and said scrambled user data sequence.

74. The DDD of claim 73 wherein said second decoder generates a first token and a second token.

75. The DDD of claim 74 wherein said first token is determined based on said seed and said H-code.

76. The DDD of claim 75 wherein said first token is determined by a bit-wise XOR operation on said seed and said H-code.

77. The DDD of claim 74 wherein said second token is a ones complement of said first token.

78. The DDD of claim 73 wherein said second decoder includes a symbol lookup table, processes two adjacent symbols of said scrambled user data sequence at a time and selectively employs first and second tokens and said symbol lookup table to decode said scrambled user data.

79. The DDD of claim 71 wherein said DDS is implemented in a read path of a data storage device.

80. A method of descrambling a scrambled user data sequence that has a plurality of symbols and a seed and that is received by a communications channel, comprising:
    processing pairs of said symbols;
    interleaving adjacent symbols in said scrambled user data sequence when an all-zero symbol is present; and
    replacing an all-one symbol with an all-zero symbol and interleaving said adjacent symbols when one of said adjacent symbols is an all-one symbol and another of said adjacent symbols is not an all-zero symbol.

81. The method of claim 80 further comprising descrambling said scrambled user data sequence based on said user data sequence and a seed to provide a user data sequence.

82. The method of claim 81 wherein said descrambling step is performed using a bit-wise XOR operation on said scrambled user data sequence and said seed.

83. The method of claim 80 wherein said communications channel also receives an H-code.

84. The method of claim 83 further comprising guaranteeing a minimum Hamming weight of said scrambled user data sequence using said H-code, said seed and said scrambled user data sequence.

85. The method of claim 84 wherein said guaranteeing step is performed based on a first token and a second token.

86. The method of claim 85 wherein said first token is determined based on said seed and said H-code.

87. The method of claim 86 further comprising determining said first token by a bit-wise XOR operation on said seed and said H-code.

88. The method of claim 85 wherein said second token is a ones complement of said first token.

89. The method of claim 84 further comprising:
    processing two adjacent symbols of said scrambled user data sequence at a time; and
    employing said first and second tokens and a symbol lookup table to selectively decode said scrambled user data.

90. A data dependent descrambler (DDD) for a communications channel that receives a scrambled user data sequence having a plurality of symbols and a seed, comprising:
    first decoding means that processes pairs of said symbols, that selectively interleaves adjacent symbols in said scrambled user data sequence when an all-zero symbol is present and that replaces an all-one symbol with an all-zero symbol and interleaves said adjacent symbols when one of said adjacent symbols is an all-one symbol and another of said adjacent symbols is not an all-zero symbol; and
    descrambling means that generates a user data sequence that is based on said scrambled user data sequence and said seed.

91. The DDD of claim 90 wherein said descrambling means performs a bit-wise XOR operation on said scrambled user data sequence and said seed to generate said user data sequence.

92. The DDD of claim 90 wherein said communications channel receives an H-code.

93. The DDD of claim 92 further comprising second encoding means for guaranteeing a minimum Hamming weight of said scrambled user data sequence using said H-code, said seed and said scrambled user data sequence.

94. The DDD of claim 93 wherein said second decoding means generates a first token and a second token.

95. The DDD of claim 94 wherein said first token is determined based on said seed and said H-code.

96. The DDD of claim 95 wherein said first token is determined by a bit-wise XOR operation on said seed and said H-code.

97. The DDD of claim 94 wherein said second token is a ones complement of said first token.

98. The DDD of claim 93 wherein said second decoding means includes a symbol lookup table, processes two adjacent symbols of said scrambled user data sequence at a time and selectively employs said first and second tokens and said symbol lookup table to encode said scrambled user data based on a Hamming weight of said two adjacent symbols.

99. The DDD of claim 90 wherein said DDS is implemented in a read path of a data storage device.

* * * * *

UNITED STATES PATENT AND TRADEMARK OFFICE
CERTIFICATE OF CORRECTION

PATENT NO. : 6,897,792 B1 Page 1 of 1
APPLICATION NO. : 10/701661
DATED : May 24, 2005
INVENTOR(S) : Weishi Feng It is certified that error appears in the above-identified patent and that said Letters Patent is hereby corrected as shown below:

Column 3, Line 11:   Insert -- to -- after "according"
Column 3, Line 64:   Delete "on" after "sequence"
Column 4, Line 8:    Delete "DOS" and insert -- DDS --
Column 4, Line 21:   Delete "DOS" and insert -- DDS --
Column 4, Line 37:   Delete "invrse" and insert -- inverse --
Column 5, Line 10:   Delete "(s, s, . . . , s)" and insert -- {s, s, ..., s} --
Claim 16, Line 4:    Insert--of--after "channel" col. 8, line 4
Claim 19, Line 16:   Insert--of--after "channel" col. 8, line 16
Claim 20, Line 18:   Insert--of--after "channel" col. 8, line 18
Claim 21, Line 20:   Insert--of--after "channel" col. 8, line 20
Claim 22, Line 23:   Insert--of--after "channel" col. 8, line 23
Claim 23, Line 25:   Insert--of--after "channel" col. 8, line 25
Claim 24, Line 32:   Insert--of--after "channel" col. 8, line 32
Claim 62, Line 64:   Insert--of--after "channel" col. 10, line 64
Claim 65, Line 10:   Insert--of--after "channel" col. 11, line 10
Claim 66, Line 13:   Insert--of--after "channel" col. 11, line 13
Claim 67, Line 15:   Insert--of--after "channel" col. 11, line 15
Claim 68, Line 18:   Insert--of--after "channel" col. 11, line 18
Claim 69, Line 20:   Insert--of--after "channel" col. 11, line 20
Claim 70, Line 27:   Insert--of--after "channel" col. 11, line 27

Signed and Sealed this

Twelfth Day of December, 2006

JON W. DUDAS
*Director of the United States Patent and Trademark Office*